US008954363B2

(12) United States Patent
Heliot et al.

(10) Patent No.: US 8,954,363 B2
(45) Date of Patent: Feb. 10, 2015

(54) DIGITAL-TO-ANALOGUE CONVERTER AND NEUROMORPHIC CIRCUIT USING SUCH A CONVERTER

(71) Applicant: Commissariat a l'Energie Atomique et aux Energies Alternatives, Paris (FR)

(72) Inventors: Rodolphe Heliot, Grenoble (FR); Xavier Jehl, Noyarey (FR); Marc Sanquer, Corenc (FR); Romain Wacquez, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 230 days.

(21) Appl. No.: 13/705,031

(22) Filed: Dec. 4, 2012

(65) Prior Publication Data

US 2013/0144821 A1 Jun. 6, 2013

(30) Foreign Application Priority Data

Dec. 5, 2011 (FR) ...................................... 11 61145

(51) Int. Cl.
*G06N 3/04* (2006.01)
*H03M 1/06* (2006.01)
*H03M 1/10* (2006.01)
*G06N 3/02* (2006.01)
*H03M 1/80* (2006.01)
*G06N 3/063* (2006.01)
*H03M 1/74* (2006.01)

(52) U.S. Cl.
CPC . *G06N 3/02* (2013.01); *H03M 1/80* (2013.01); *G06N 3/0635* (2013.01); *H03M 1/0653* (2013.01); *H03M 1/1042* (2013.01); *H03M 1/747* (2013.01)
USPC .............................. 706/36; 341/120; 341/144

(58) Field of Classification Search
USPC ............................................................ 706/36
See application file for complete search history.

(56) References Cited

U.S. PATENT DOCUMENTS

| 5,222,193 | A  | * | 6/1993  | Brooks et al. ................... 706/26 |
| 6,505,182 | B1 | * | 1/2003  | Van den Heuvel .............. 706/34 |
| 6,707,404 | B1 | * | 3/2004  | Yilmaz ........................ 341/144 |
| 2003/0231124 | A1 |   | 12/2003 | Yang |
| 2005/0030214 | A1 | * | 2/2005  | Jo ................................ 341/145 |
| 2012/0196546 | A1 | * | 8/2012  | Ly-Gagnon ..................... 455/73 |
| 2013/0262358 | A1 | * | 10/2013 | Heliot et al. ................... 706/27 |

OTHER PUBLICATIONS

Waller, W.A.J. et al. "An Analogue Neuron Suitable for a Data Frame Architecture." VLSI for Artificial Intelligence and Neural Networks. Springer US, 1991. 195-204.*

* cited by examiner

*Primary Examiner* — Jeffrey A Gaffin
*Assistant Examiner* — Benjamin Buss
(74) *Attorney, Agent, or Firm* — Baker & Hostetler LLP

(57) ABSTRACT

A digital-to-analogue converter, with application to electronic circuits with neuromorphic architecture, comprises: transistors of identical nominal geometrical characteristics, but of dispersed current-voltage characteristics, wherein when a constant gate-source voltage is applied to the different transistors, a current varying as a function of the dispersion circulates in the transistor; a digital table receiving a digital word and having a selection output selecting, as a function of the word to be converted, a transistor or transistors supplying a current of desired value representing this word in analogue form. The look-up table is loaded as a function of real measured current-voltage characteristics of different transistors of the set, to establish a look-up between words and current values. The wide variability of characteristics of the transistors, notably their leakage current for a gate-source voltage below the switch-on threshold, allows finding combinations of leakage currents which are a good representation of words to be converted.

9 Claims, 4 Drawing Sheets

DIGITAL-TO-ANALOGUE CONVERTER AND NEUROMORPHIC CIRCUIT USING SUCH A CONVERTER

CROSS-REFERENCE TO RELATED APPLICATION

This application claims priority to foreign French patent application No. FR 1161145, filed on Dec. 5, 2011, the disclosure of which is incorporated by reference in its entirety.

FIELD OF THE INVENTION

The invention relates on the one hand to a novel type of digital-to-analogue converter and on the other hand to an electronic circuit with neuromorphic architecture using such a converter. The digital-to-analogue converter is very specifically designed for a use in the context of a neuromorphic circuit but it may also have other uses. It will be described in this context for which it has been designed.

BACKGROUND

Neuromorphic circuits are networks of multiple cells, configured in such a way as to somewhat imitate the behaviour of biological neuronal networks. Biological neuronal networks comprise elementary neurons which receive and emit information, and synapses which connect these neurons to other neurons. By analogy, the neuromorphic circuits generally comprise a matrix network of elementary processing cells that will be called neurons, each identified by a respective address in the memory, and a matrix memory with as many elementary memories as there are neurons; each elementary memory is associated with a neuron and can therefore be identified by the unique address of this neuron; it contains addresses of other neurons which have to receive information from the neuron corresponding to this elementary memory.

Hereinbelow, the so-called "discharging" neurons will be considered. These neurons receive input signals from other neurons; they process them in generally analogue form and produce a result. The result can be the emission of an event signal, for example a pulse at a given moment. It is this pulse, called "neuron discharge", which is used to fetch from the elementary memory associated with the neuron not only the addresses of other neurons (target neurons or destination neurons), but also weights associated with each of these addresses. The associated weights signify that a neuron will influence one or more other neurons in a weighted manner and not in an undifferentiated manner.

The addresses of the neurons influenced by a neuron are called post-synaptic addresses; the associated weights are called synaptic weights.

For example, an analogue elementary neuron may be constructed in the form of a time integrator with leakage; its internal potential represents the algebraic sum of several potentials applied over time to its inputs by other neurons, this sum being affected by leakage currents; when the internal potential reaches a certain threshold, the neuron signals this event by emitting an event signal which is a pulse of very short duration, often called "spike". The potential then reverts to an idle state, awaiting new inputs. The event signal, or spike, is used, with the address of the neuron which has emitted it, to extract the content of the elementary memory associated with this address; this content is made up of one or more post-synaptic addresses and their associated synaptic weights. These addresses and weights are received by a processing circuit which generates weighted input signals and which transmits them as input signals to the neurons corresponding to the post-synaptic addresses.

In the prior art as illustrated in FIG. 1, the event signal deriving from the discharge of a neuron from the neuronal matrix RN is applied to an address encoder ENC which determines the address of the neuron which has generated the event and which sends this address over a so-called pre-synaptic bus $B_{pre-syn}$. The pre-synaptic bus is an address bus for the memory. This bus is managed by a controller CTRL which applies this address to the memory MEM and which collects from the memory one or more post-synaptic addresses and the weights associated with each of them. The controller successively emits the different post-synaptic addresses over a post-synaptic address bus $B_{post-syn}$ which applies these addresses to an address decoder DEC associated with the neuronal matrix RN. At the same time, the controller sends the synaptic weights to a digital-to-analogue converter DAC which establishes analogue levels as a function of each synaptic weight. An analogue signal level corresponding to a determined synaptic weight is therefore applied to each of the post-synaptic neurons identified by the content of the elementary memory which has been activated by the event signal.

The neuron can be schematically represented as in FIG. 2 by a capacitive node ND, of capacitance $C_{nd}$. This node is connected to the input of a threshold comparator CMP. The input of the neuron consists of a terminal E linked to the node ND; this is a current input and the input current is used to charge (or discharge) the capacitance. For example, a current pulse of determined time width, positive or negative, of amplitude representing a synaptic weight, is applied to the input E each time the neuron is designated by another neuron. Moreover, the capacitive node may exhibit leaks so that the capacitance of the node is discharged progressively if new charge pulses do not arrive at the input E. When the voltage at the terminals of the capacitance increases sufficiently to reach the threshold of the comparator, the latter emits a brief pulse which is the event signal or spike from the neuron.

FIG. 3 represents a post-synaptic neuron which has been designated by the post-synaptic bus and which can then receive from the digital-to-analogue converter DAC an analogue signal whose amplitude represents a synaptic weight. This signal is a brief current pulse. The synaptic weight Pds is contained in digital form in the memory MEM, at the address of the neuron (pre-synaptic) which has emitted a spike to the post-synaptic neuron considered here. The digital-to-analogue converter converts this digital weight into an analogue current value emitted during a pulse of predefined duration.

Numerous embodiments of digital-to-analogue converters exist, but it is important to produce the converter in a particularly simple form. The aim of the invention is to propose a digital-to-analogue converter which is of simple construction and has little bulk, which can be used more particularly in this neuromorphic circuit application.

SUMMARY OF THE INVENTION

The invention relies on the fact that the industrial integrated circuit fabrication technologies result in a dispersion, which is undesirable but exploited here, of the individual characteristics of the elements of the integrated circuit, and notably of the transistors. Thus, transistors which all have the same nominal geometrical characteristics should all supply the same current for one and the same gate-source voltage, but in reality supply currents that differ widely from one to another. This dispersion is all the greater as the transistors become smaller; now, the technology is tending to evolve toward increasingly small transistors, to be able to maximize the number of transistors on a given integrated circuit surface area. The dispersion is particularly sensitive for transistors with length by width dimensions less than 40×100 nm², and even more for 20×50 nm².

The digital-to-analogue converter according to the invention comprises:
- a set of several transistors of identical nominal geometrical characteristics but of dispersed current-voltage characteristics such that, when a constant gate-source voltage is applied to the different transistors, a current that is variable as a function of the dispersion circulates in the transistor,
- a digital look-up table having a digital input for receiving a word to be converted and a selection output for selecting from the set of transistors, as a function of the word to be converted, a transistor or a group of transistors supplying a current of desired value representing this word in analogue form,
- a current output supplying the current delivered by the selected transistor or group of transistors, all receiving a nominal gate-source voltage,
- and means for loading into the digital look-up table, at a determined address, a datum determining the selection of the transistor or of the group of transistors, as a function of real measured current-voltage characteristics of the different transistors of the set, to establish a look-up between words to be converted and current values obtained by the selection of the transistors, the look-up table being different from that which would be obtained if the transistors all had said nominal characteristics.

Preferably, the gate-source voltage applied to the transistors is a voltage less than the switch-on threshold voltage Vt of the transistors.

Preferably, the selection output of the look-up table comprises a number of output conductors each connected to the drain of a respective transistor, the sources of the transistors all being linked to the output of the converter, so that the output of the converter supplies the sum of the currents passing through those of the transistors which are selected by the table, the other transistors not supplying any current.

The output conductors of the table can have two states which are a first high impedance state in which the drains of the transistors do not receive power supply voltage and cannot therefore have a current flowing through them, and a second state in which the drains of the transistors receive a power supply and can therefore supply a current.

The invention relates also to the main application for which this converter has been designed, namely a neuromorphic circuit comprising:
- a neuronal network with each neuron identified by a neuron address in the network, each neuron being able to receive and process at least one input signal then later emit to an output of the neuron a signal representing an event which occurs inside the neuron,
- a programmable memory which can be addressed by the address of a neuron having emitted an event signal representing a result of the activity of the neuron, the memory containing at this address a digital datum comprising one or more post-synaptic neuron addresses and a respective post-synaptic weight associated with each post-synaptic address,
- means for extracting from the memory the datum relating to a neuron, after this neuron has emitted an event signal representing a result of the activity of the neuron,
- a digital-to-analogue converter for applying, to the input of a post-synaptic neuron identified by an address contained in the datum, a current pulse, the amplitude of which represents the post-synaptic weight associated with this address in the datum, wherein the digital-to-analogue converter comprises
- at least one set of several transistors of identical nominal geometrical characteristics but of dispersed current-voltage characteristics such that, when a constant gate-source voltage is applied to the different transistors, a current that is variable as a function of the dispersion circulates in the transistor,
- a digital look-up table having a digital input and a selection output for selecting, as a function of the digital input, a transistor or a group of transistors from the set,
- a current output supplying the current delivered by the selected transistor or group of transistors, all receiving a nominal gate-source voltage,
- and means for loading into the digital look-up table determined data determining the selection of transistors, as a function of real measured current-voltage characteristics of the different transistors of the set, the look-up table being different from the one which would be obtained if the transistors all had said nominal characteristics.

In a first embodiment, the converter is common to all the neurons; the set of transistors which performs the current conversion is common to all the neurons. The programmable memory sends a post-synaptic neuron address to select this neuron and it sends to the look-up table a digital word representing the synaptic weight associated with this neuron. The current output of the converter is applied to the post-synaptic neuron designated by the memory. The post-synaptic neurons are activated in succession if there are several thereof, the converter being able to convert only one synaptic weight at a time.

In another embodiment, an individual converter is placed upstream of each neuron so that there is a set of m transistors associated with each neuron and placed upstream of the capacitive node of the neuron; if there are N neurons, there are therefore N sets of m transistors; the look-up table consists of the programmable memory itself which receives a pre-synaptic neuron address; this address designates at least one post-synaptic neuron and therefore designates a set of m transistors associated with this neuron. However, the table designates not only this set but more specifically a transistor or a group of transistors of the set; in practice, the look-up table therefore directly addresses a transistor or a group of transistors out of m times N transistors. The synaptic weight is entered in the table not in the form of a digital value but directly in the form of a code for selecting the transistors of a set. With this structure, it is possible to apply simultaneously to several post-synaptic neurons the current pulses having desired amplitudes.

Generally, the circuit structure according to the invention makes it possible to improve efficiency in terms of power consumption and integrated circuit surface area.

It will be noted that the patent document US2003/231124 describes a converter using several transistors of identical nominal characteristics but not using the dispersion of the real characteristics. Quite the contrary, the converter of that document operates correctly only if the transistors do not have any dispersion of their characteristics.

BRIEF DESCRIPTION OF DRAWINGS

Other features and advantages of the invention will emerge from reading the following detailed description which is given with reference to the appended drawings in which.

DETAILED DESCRIPTION

Figure 4:
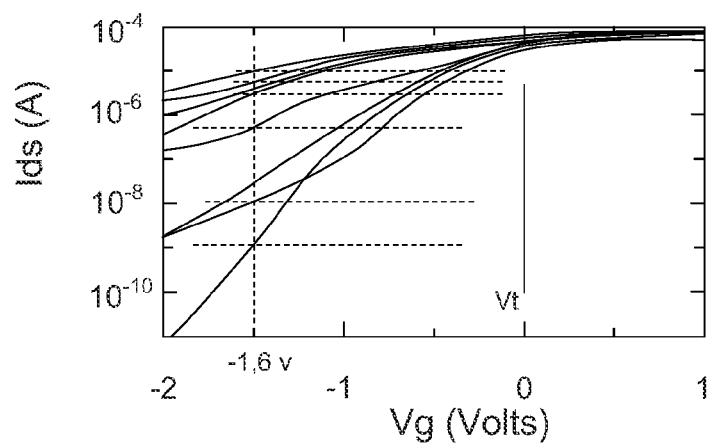
FIG. 4 represents an example of dispersed curves of transistors of theoretically identical geometrical characteristics.

FIG. 4 shows, by way of example, a set of current-voltage characteristics of transistors that all have the same nominal dimensions and the same fabrication technology. These are very small transistors, the channel length of which is 10 nanometres. Eight curves of transconductance values are represented, corresponding to nominally identical transistors.

The x-axis gives the gate-source voltage Vg in linear scale in volts and the y-axis gives the value of the drain-source current Ids in logarithmic scale. The drain-source voltage is 1 volt, but the principle remains the same for a lower bias voltage. A very wide dispersion of the curves can be seen, notably for a voltage Vg under the switch-on threshold Vt of the transistor, here a threshold of approximately 0 volt but the threshold could be greater or less than 0. The dispersion increases when the gate-source voltage deviates more from the threshold. If we take, for example, a gate-source voltage of −1.6 volts for a threshold of 0 volt, the currents generated by these eight transistors vary between approximately $10^{-9}$ and $10^{-5}$ amperes. These curves were recorded for transistors with an effective channel length of 10 nanometres intended for very high density integrated circuits.

The high variability of the leakage currents may be due to a variable presence of undesirable dopants in the centre of the channel, the centre of the channel being very close to the doped sources and drains of the transistor when the transistor is of very small size and when the channel dopant is of the same nature as that of the source and drain. It may also be due to the local fluctuations of different geometrical parameters such as the thickness of the gate oxide, the roughness of the etchings, etc. The variability may equally be due to other factors; permittivity of the gate oxide, size of the metal grains, doping granularity.

Figure 5:
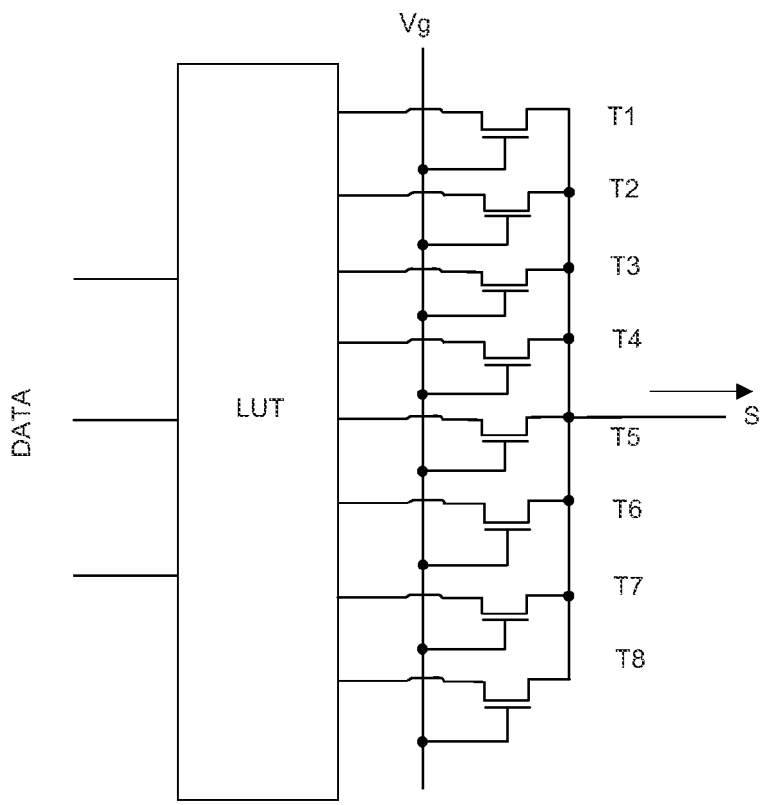
FIG. 5 represents the schematic diagram of the digital-to-analogue converter according to the invention.

FIG. 5 represents the principle of the digital-to-analogue converter with current output according to the invention. It comprises a selection circuit LUT which is a digital look-up table receiving as input a digital word "DATA" of p bits to be converted, here, for example, a word of 3 bits, and supplying on its outputs a digital code used to select one or more transistors of a set of m transistors. The look-up table LUT therefore comprises m outputs supplying a high or low logic signal depending on the value of the bits of the word applied to the input. For example, the high level on the output signifies the selection of a transistor and the low level signifies the absence of selection. In the simplest example, the table comprises $m=2^p$ outputs and it establishes a high logic level on just one output as a function of the input word, the other outputs being at the low level. However, in other examples, the table has m outputs, m different from $2^p$, and can set one or more outputs to the high logic level.

In the example represented in FIG. 5, it has been assumed that the set of transistors comprises m=8 transistors T1 to T8 which all have the same nominal physical characteristics (same lengths, widths, depths and dopant concentrations). Each output is applied to the drain of a respective transistor to apply to it a power supply voltage if the transistor is selected but no power supply voltage if it is not selected. The sources of the transistors are all linked to a common output S of the converter. This output constitutes a current output. The gates of all the transistors are brought to a common nominal potential Vg, preferably, as has been stated, a potential below the switch-on threshold Vt of the transistor; a current that can be called leakage current then passes into the transistor, but only if it is selected by the look-up table. The output S delivers a global leakage current; this current is the sum of the leakage currents of the transistors which receive a power supply voltage (high logic level supplied by the look-up table) on their drain; the other transistors do not supply any leakage current.

Because of the fact that the transistors, although theoretically identical, have leakage currents that are different but stable in time, the look-up table is filled with data which map to each input word an output current representing an analogue value of the input word. The filling of the table is done on the basis of measurements performed on the circuit. From these measurements, the currents or sums of currents of transistors which best represent the analogue values desired for each digital word value at the input of the converter are sought. The table is filled accordingly for the application of a digital word to the input to result in the selection of a transistor or of a group of transistors for which the sum of the leakage currents represents the analogue value desired to represent this digital word. Statistically, the wide variability of the characteristics of the transistors makes it possible to find a selection that results in a value that is sufficiently close to the desired value.

The resulting look-up table is different from that which would be obtained if the transistors all had characteristics identical to the nominal characteristics.

To measure the leakage currents of the different transistors, the simplest way is to evaluate the currents supplied by all the possible combinations of 1 to m transistors, then to select a series of $2^p$ values which best represent an acceptable analogue value for a given input word. A word which represents the combination of transistors to be activated to obtain this value in the best possible manner is loaded into the table at each of the $2^p$ addresses of the table.

Figure 2:
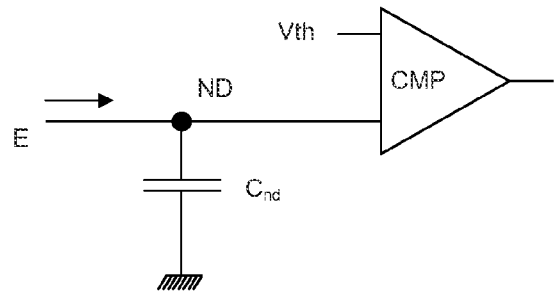
FIG. 2, already described, represents a simplified neuron diagram.
Figure 3:
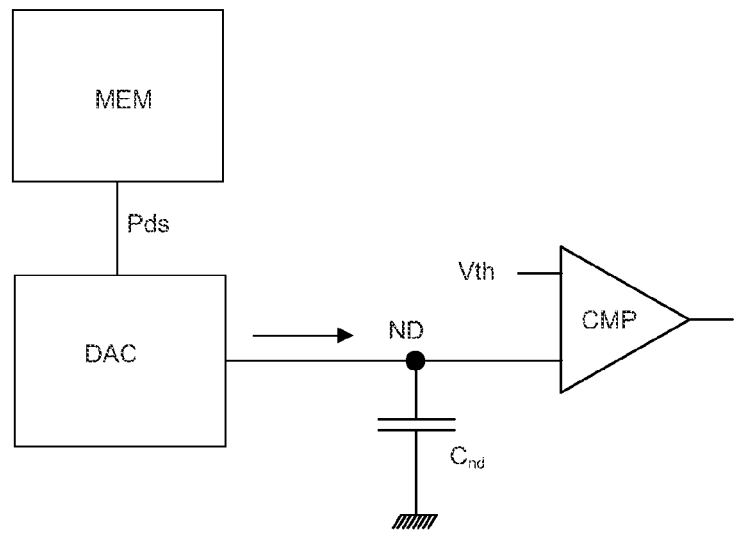
FIG. 3, already described, represents the neuron to which is applied a current representing a post-synaptic weight obtained from a memory.

One way of measuring the leakage current of a transistor is to link the source of the transistor to a capacitance (similar to the neuron of FIG. 2) linked to a threshold comparator, apply successive voltage pulses to the drain of this transistor (the gate of which is at the nominal voltage Vg), and count the number N of pulses of constant width dt which result in the switchover of the threshold comparator. This number becomes all the lower as the leakage current of the transistor increases. The duration of the pulses will be chosen to be brief for a fine measurement of the leakage current. If the measurement is done by a neuron or a pseudo-neuron of capacitance $C_{nd}$ and of threshold voltage Vth, the value of the leakage current of a given transistor linked to this neuron will be given by the formula $I=C_{nd} \cdot Vth/N \cdot dt$, assuming that the natural leakage current of the neuron itself is disregarded in this measurement.

In use, after having loaded the look-up table as a function of the measurements made, a word to be converted is applied to the input of the converter, that is to say to the input of the look-up table, and the analogue current is used on the output S.

Figure 1:
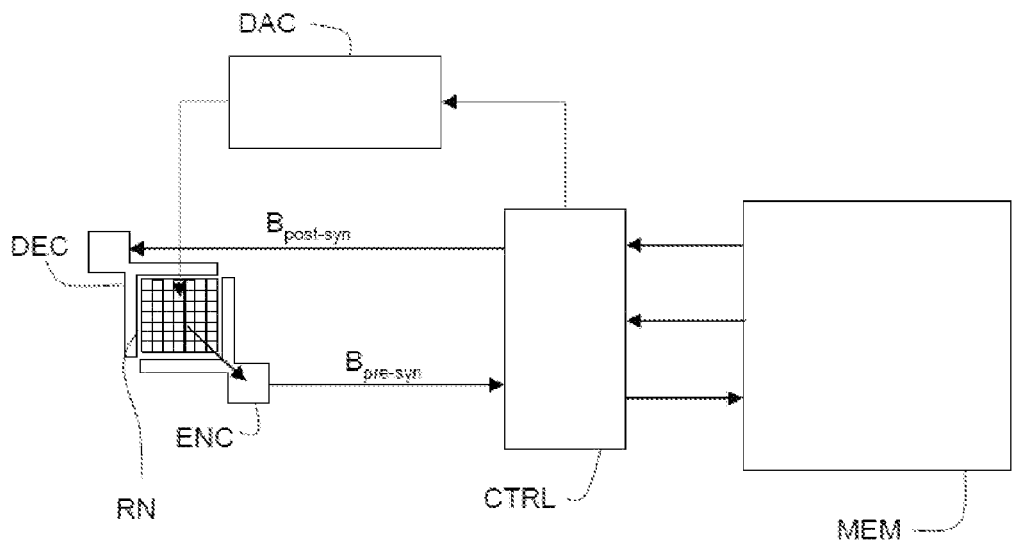
FIG. 1, already described, represents the structure of a neuronal network of the prior art.

According to the invention, a main application of this converter is the incorporation of the converter in a neuromorphic circuit such as that of FIG. 1.

Figure 6:
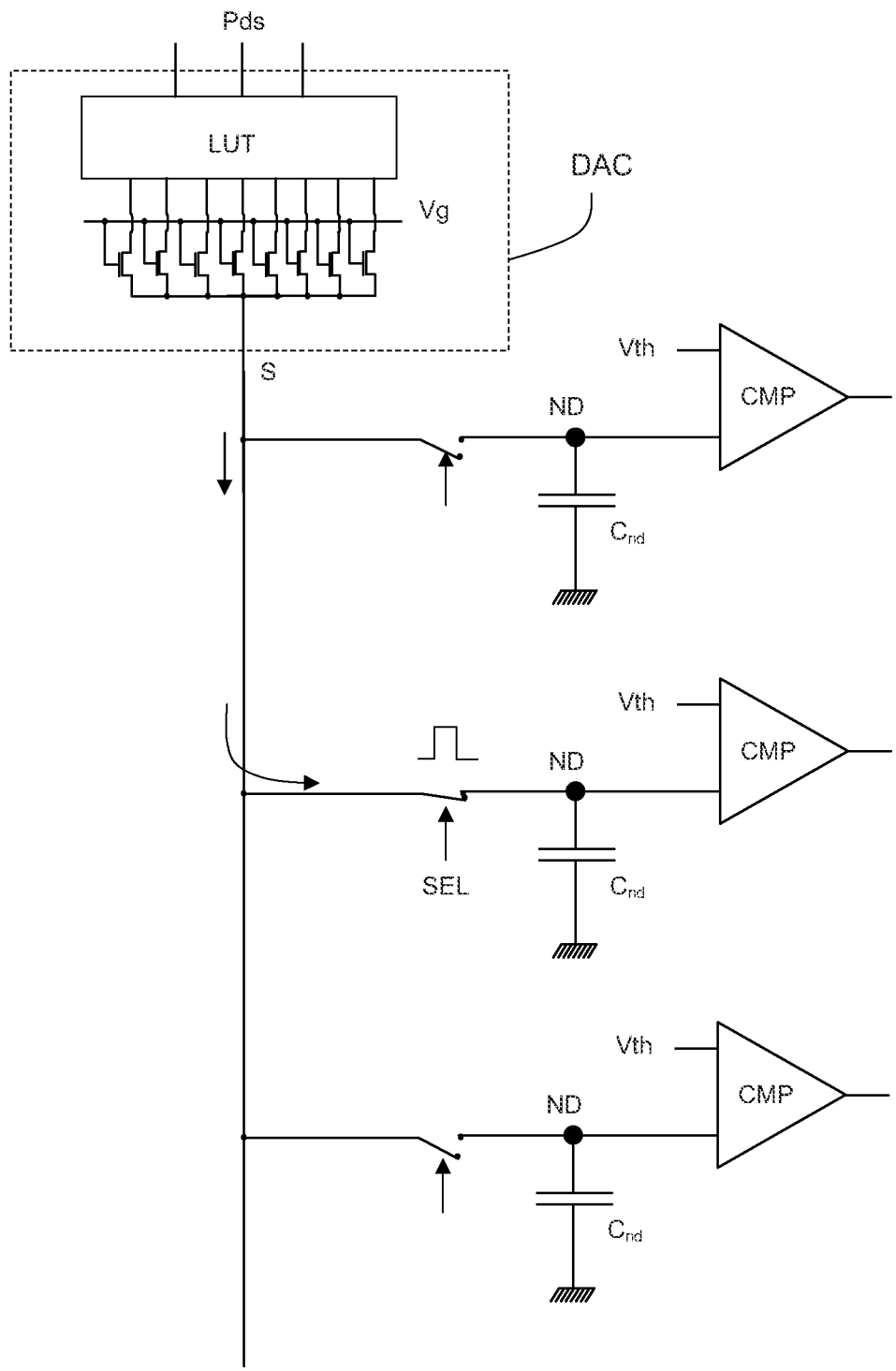
FIG. 6 represents a first embodiment of a neuromorphic circuit using a converter according to the invention.

FIG. 6 represents a first variant embodiment in which there is a single digital-to-analogue converter for all the neurons of the circuit. Three neurons are represented in the same form as that of FIG. 2, namely with a capacitive node ND and a threshold comparator CMP. A post-synaptic neuron designated by the post-synaptic bus can be selected by a signal SEL from the decoder DEC of FIG. 1. This neuron then receives the output current of the digital-to-analogue converter DAC of FIG. 5; the converter has at the same time received the synaptic weight Pds supplied by the post-synaptic bus and the current supplied to the neuron is an analogue current representing this weight.

Figure 7:
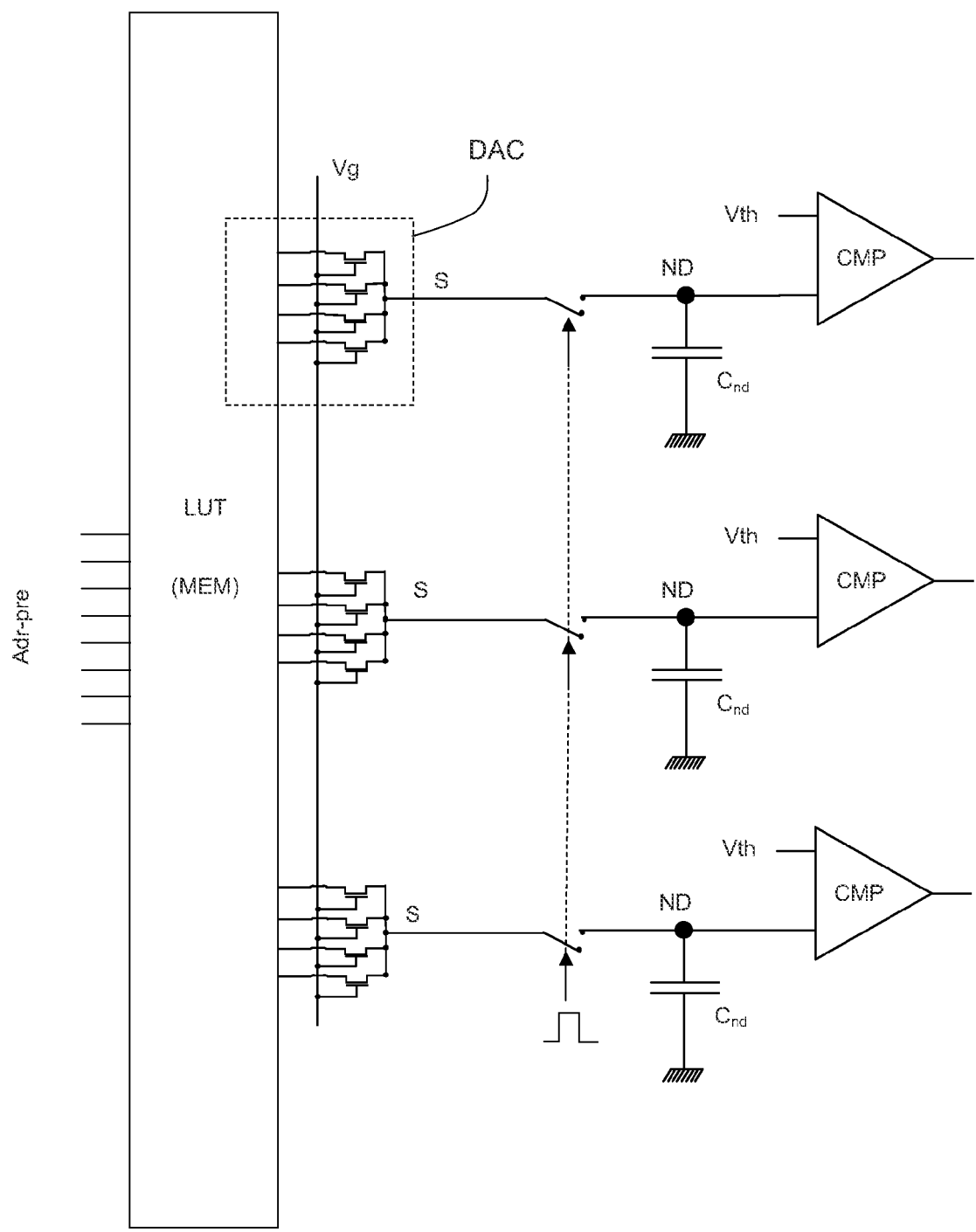
FIG. 7 represents a second embodiment of a neuromorphic circuit using a converter according to the invention.

FIG. 7 represents another variant in which there is a digital-to-analogue converter structure associated with each neuron and not an overall converter structure for all the neurons. The look-up table LUT of the converter is then merged with the memory MEM of FIG. 1, and this table designates both a post-synaptic neuron, therefore a set of m transistors associated with this neuron, and the transistor or transistors to be selected in this set of m transistors. In FIG. 7, it has been assumed that m=4.

The look-up table is therefore a digital table which maps a pre-synaptic address Adr-pre (the address of the neuron which has emitted an event) with a selection of one or more transistors out of m transistors. The synaptic weight represented by this selection is entered in the table in a digital form which is directly a code for selecting the transistors. If the pre-synaptic neuron invokes several post-synaptic neurons, the look-up table maps to a pre-synaptic address several groups of transistors corresponding to different post-synaptic neurons. The current pulse can be applied simultaneously to all the post-synaptic neurons, whereas in the embodiment of FIG. 6, a current pulse can be applied by a converter to only one post-synaptic neuron at a time. FIG. 7 represents, by way of example, switches between each set of transistors and the associated neuron, the simultaneous closure of all the switches making it possible to apply a current pulse of duration dt to those of the neurons which are selected and with a respective amplitude according to the transistors selected for each of them.

The invention claimed is:

1. A digital-to-analogue converter, comprising:
   a set of several transistors of identical nominal geometrical characteristics but of dispersed current-voltage characteristics such that, when a constant gate-source voltage is applied to the different transistors, a current that is variable as a function of the dispersion circulates in the transistor,
   a digital look-up table having a digital input for receiving a word to be converted and a selection output for selecting from the set of transistors, as a function of the word to be converted, a transistor or a group of transistors supplying a current of desired value representing this word in analogue form,
   a current output supplying the current delivered by the selected transistor or group of transistors, all receiving a nominal gate-source voltage, and
   means for loading into the digital look-up table, at a determined address, a datum determining the selection of the transistor or of the group of transistors, as a function of real measured voltage-current characteristics of the different transistors of the set, to establish a look-up between words to be converted and current values obtained by the selection of the transistors, the look-up table being different from that which would be obtained if the transistors all had said nominal characteristics.

2. A digital-to-analogue converter according to claim 1, wherein the gate-source voltage applied to the transistors is a voltage less than a switch-on threshold Vt of the transistor.

3. A digital-to-analogue converter according to claim 2, wherein the selection output of the look-up table comprises a number of output conductors each connected to a respective drain of a respective transistor, the transistors each having a source connected to the output of the converter, so that the output of the converter supplies the sum of the currents passing through those of the transistors which are selected by the table, the other transistors not supplying any current.

4. A digital to analogue converter according to claim 3, wherein the output conductors of the table have two states which are a first high impedance state in which the drains of the transistors do not receive power supply voltage, and a second state in which the drains of the transistors receive a power supply and can therefore supply a current.

5. A digital-to-analogue converter according to claim 1, wherein the selection output of the look-up table comprises a number of output conductors each connected to a respective drain of a respective transistor, the transistors each having a source connected to the output of the converter, so that the output of the converter supplies the sum of the currents passing through those of the transistors which are selected by the table, the other transistors not supplying any current.

6. A digital to analogue converter according to claim 5, wherein the output conductors of the table have two states which are a first high impedance state in which the drains of the transistors do not receive power supply voltage, and a second state in which the drains of the transistors receive a power supply and can therefore supply a current.

7. A neuromorphic circuit comprising
   a neuronal network with each neuron identified by a neuron address in the network, each neuron being able to receive and process at least one input signal then later emit to an output of the neuron a signal representing an event which occurs inside the neuron,
   a programmable memory which can be addressed by the neuron address of a neuron having emitted an event signal representing a result of an activity of the neuron, the programmable memory containing at this address a digital datum comprising one or more post-synaptic neuron addresses and a respective post-synaptic weight associated with each post-synaptic address,
   reading means for extracting from the memory the datum relating to a neuron, after this neuron has emitted an event signal representing a result of the activity of the neuron, and
   a digital-to-analogue converter for applying, to the input of a post-synaptic neuron identified by an address contained in the datum, a current pulse, the amplitude of which represents the post-synaptic weight associated with this address in the datum,
   wherein the digital-to-analogue converter comprises
      at least one set of several transistors of identical nominal geometrical characteristics but of dispersed current-voltage characteristics such that, when a constant gate-source voltage is applied to the different transistors, a current that is variable as a function of the dispersion circulates in the transistor,
      a digital look-up table having a digital input and a selection output for selecting, as a function of the digital input, a transistor or a group of transistors from the set, a current output supplying the current delivered by the selected transistor or group of transistors, all receiving a nominal gate-source voltage, and means for loading into the digital look-up table determined data determining the selection of transistors, as a function of real measured current-voltage characteristics of the different transistors of the set, the look-up table being different from the one which would be obtained if the transistors all had said nominal characteristics.

8. The neuromorphic circuit according to claim 7, wherein the digital-to-analogue converter is common to all the neurons, said at least one set of transistors being common to all the neurons.

9. The neuromorphic circuit according to claim 7, further comprising a set of m transistors associated with each neuron and placed upstream of a capacitive node of the neuron, and wherein the look-up table consists of the programmable memory which receives a pre-synaptic neuron address and which selects at least one set of m transistors and, in this set, a transistor or a group of transistors, in order to apply to an associated neuron a current corresponding to the selected transistor or group of transistors.

* * * * *